United States Patent [19]

Dansky et al.

[11] Patent Number: 5,030,856
[45] Date of Patent: Jul. 9, 1991

[54] RECEIVER AND LEVEL CONVERTER CIRCUIT WITH DUAL FEEDBACK

[75] Inventors: Allan H. Dansky, Poughkeepsie; Chris J. Rebeor, Beacon; Dennis C. Reedy, Stormville, all of N.Y.

[73] Assignee: International Business Machines Corporation, Armonk, N.Y.

[21] Appl. No.: 347,542

[22] Filed: May 4, 1989

[51] Int. Cl.⁵ .................. H03K 3/29; H03K 19/02; H03L 5/00
[52] U.S. Cl. ........................ 307/475; 307/446; 307/290; 307/359; 307/264
[58] Field of Search ............ 307/475, 446, 290, 359, 307/264, 494, 495

[56] References Cited

U.S. PATENT DOCUMENTS

| | | | |
|---|---|---|---|
| 3,900,746 | 8/1975 | Kraft et al. | 307/264 |
| 3,974,402 | 8/1976 | Fett et al. | 307/475 |
| 3,974,456 | 8/1976 | Russell et al. | 330/300 |
| 3,988,595 | 10/1976 | Eatock | 307/235 |
| 4,074,150 | 2/1978 | Buckley, III et al. | 307/362 |
| 4,256,974 | 3/1981 | Padgett et al. | 307/475 |
| 4,359,649 | 11/1982 | Mündel | 307/290 |
| 4,375,598 | 3/1983 | Sakai | 307/290 |
| 4,379,267 | 4/1983 | Young | 330/253 |
| 4,437,171 | 3/1984 | Hudson et al. | 307/475 |
| 4,438,349 | 3/1984 | Shoji | 307/362 |
| 4,453,095 | 6/1984 | Wrathall | 307/475 |
| 4,456,840 | 6/1984 | Ide et al. | 307/359 |
| 4,490,633 | 12/1984 | Noufer et al. | 307/475 |
| 4,563,600 | 1/1986 | Kobayashi et al. | 307/455 |
| 4,563,601 | 1/1986 | Asano et al. | 307/475 |
| 4,603,299 | 7/1986 | Monett | 307/359 |
| 4,614,882 | 9/1986 | Parker et al. | 307/475 |
| 4,634,897 | 1/1987 | Yoshioka | 307/359 |
| 4,634,983 | 1/1987 | Scheimmel et al. | 307/290 |
| 4,645,951 | 2/1987 | Uragami | 307/446 |
| 4,645,954 | 2/1987 | Schuster | 307/475 |
| 4,654,549 | 3/1987 | Hannington | 307/475 |
| 4,656,372 | 4/1987 | Sani et al. | 307/475 |
| 4,682,056 | 7/1987 | Gaudenzi et al. | 307/456 |
| 4,689,503 | 8/1987 | Suzuki et al. | 307/475 |
| 4,697,109 | 9/1987 | Honma et al. | 307/475 |
| 4,704,549 | 11/1987 | Sanwo et al. | 307/475 |
| 4,733,110 | 3/1988 | Hara et al. | 307/446 |
| 4,767,951 | 8/1988 | Cornish et al. | 307/475 |
| 4,775,807 | 10/1988 | Bukowski, Jr. | 307/491 |
| 4,779,015 | 10/1988 | Erdelyi | 307/475 |
| 4,779,016 | 10/1988 | Sugiyama et al. | 307/475 |
| 4,782,251 | 11/1988 | Tsugaru et al. | 307/475 |
| 4,788,205 | 11/1988 | Sanwo et al. | 307/475 |
| 4,788,459 | 11/1988 | Tsugaru et al. | 307/475 |
| 4,789,798 | 12/1988 | Lach | 307/290 |
| 4,812,676 | 3/1989 | Yang et al. | 307/290 |
| 4,899,068 | 2/1990 | Klose et al. | 307/494 |

OTHER PUBLICATIONS

IBM Technical Disclosure Bulletin, vol. 31, No. 2, pp. 474–475, Jul. 1988, G. Boudon et al., "High-Speed ECL Bifet Receiver For High-End System".

IEEE Journal of Solid-State article, vol. 23, No. 1, pp. 59–66, Feb. 1988, B. A. Chappell et al., "Fast CMOS ECL Receivers With 100-mV Worst-Case Sensitivity".

IEEE Journal of Solid-State Circuits article, vol. 3, No. 1 pp. 68–73, Feb. 1988, T. Douseki et al., "BICMOS Circuit Technology For A High-Speed SRAM".

(List continued on next page.)

Primary Examiner—Timothy P. Callahan
Attorney, Agent, or Firm—Otho B. Ross; Richard A. Romanchik

[57] ABSTRACT

A receiver and level converter circuit is disclosed which may be used, for example, in converting low-level logic or other signals to high-level signals. In one embodiment, the circuit includes a differential amplifier having two feedback loops to provide an output signal having hysteresis, for increased gain, better noise margin and compensation. Each feedback loop includes a nonlinear difference network. In a preferred embodiment, the circuit is implemented in BICMOS technology, uses out-of-phase FETs as pull-down devices, and may be used to convert ECL-level signals to CMOS or BICMOS-level signals.

17 Claims, 5 Drawing Sheets

OTHER PUBLICATIONS

IEEE Journal of Solid-State Circuits article, vol. 23, No. 5, pp. 1030, 1036 & 1037, Oct. 1988, T. S. Yang et al., "A 4-ns 4K X 1-bit Two-Port BICMOS SRAM".

IEEE Journal of Solid-State Circuits article, vol. 23, No. 5, pp. 1048–1053, Oct. 1988, R. A. Kertis et al., "A 12-ns ECL I/O 256K X 1-bit SRAM Using a 1-um BICMOS Technology".

IEEE Journal of Solid-State Circuits article, vol. SC-21, No. 5, pp. 681–684, Oct. 1986, K. Ogiue et al., "13-ns, 500-m, 64-kbit ECL RAM Using Hi-BICMOS Technology".

IEEE ISSCC'88 article, pp. 184–185 and 361, Feb. 18, 1988, N. Tamba et al., "An 8ns 256k BICMOS RAM".

IEEE ISSCC'88 article, pp. 186–187 & 362–363, Feb. 18, 1988, R. Kertis et al., "A 12ns 256k BICMOS SRAM".

IEEE 1988 Bipolar Circuits & Technology Meeting, paper 1.2, Sep. 1988, H. Itoh et al., "Advanced ECL With New Active Pull-Down Emitter-Followers".

IBM Technical Disclosure Bulletin, vol. 30, No. 6, pp. 66–67, Nov. 1987, M. R. Gruver et al., "GPI To CMOS Logic Level Converter Or Receiver".

IBM Technical Disclosure Bulletin, vol. 30, No. 8, pp. 394–395, Jan. 1988, G. Boudon et al., "TTL Level High Speed Bifet Receiver".

IBM Technical Disclosure Bulletin, vol. 30, No. 11, pp. 368–369, Apr. 1988, E. R. Bukowski, "CMOS Differential Amplifier With Wide Hysteresis".

IBM Technical Disclosure Bulletin, vol. 22, No. 8B, pp. 3751–3752, Jan. 1980, K. Bernstein et al., "TTL to FET Logic Level Converter".

IBM Technical Disclosure Bulletin, vol. 28, No. 8, pp. 3448–3449, Jan. 1986, D. Swietek, "General Purpose Interface Receiver Using Short Channel CMOS Devices".

IBM Technical Disclosure Bulletin, vol. 28, No. 11, p. 5113, Apr. 1986, R. J. Kroesen et al., "Receiver Circuit With Differential Current Logic Output".

(DUAL FEEDBACK)

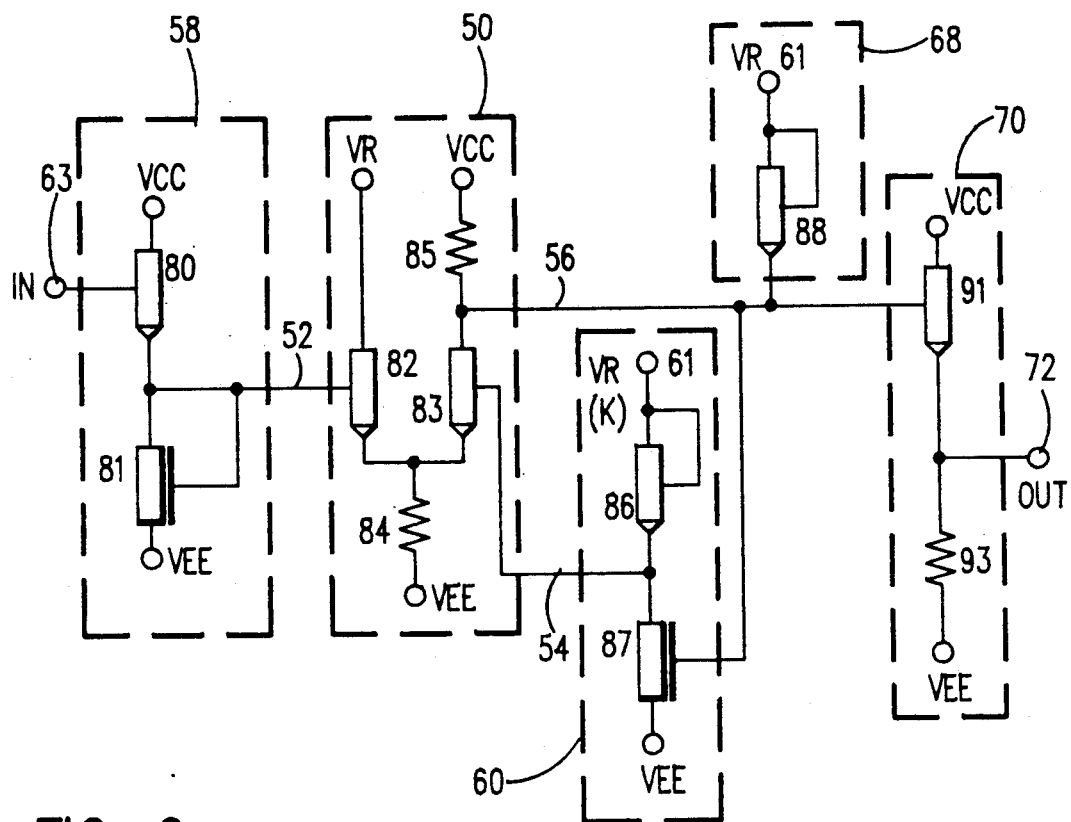
FIG. 6 (SINGLE FEEDBACK)
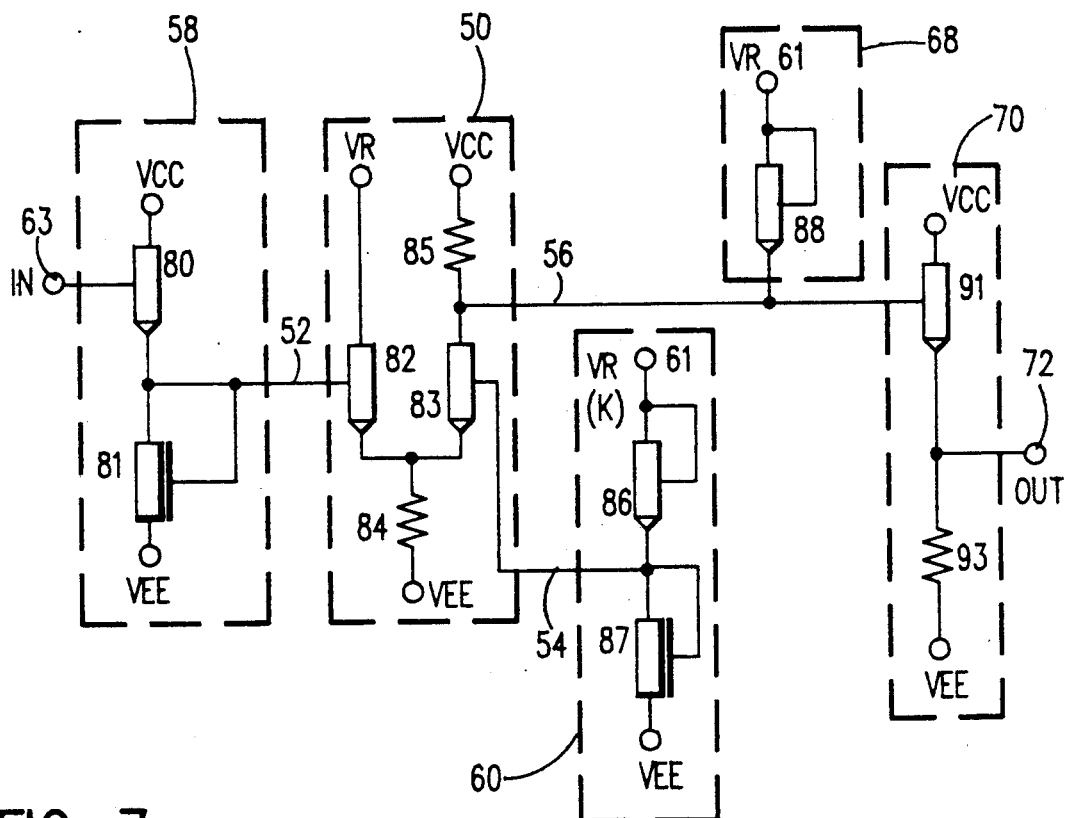
FIG. 7 (NO FEEDBACK)

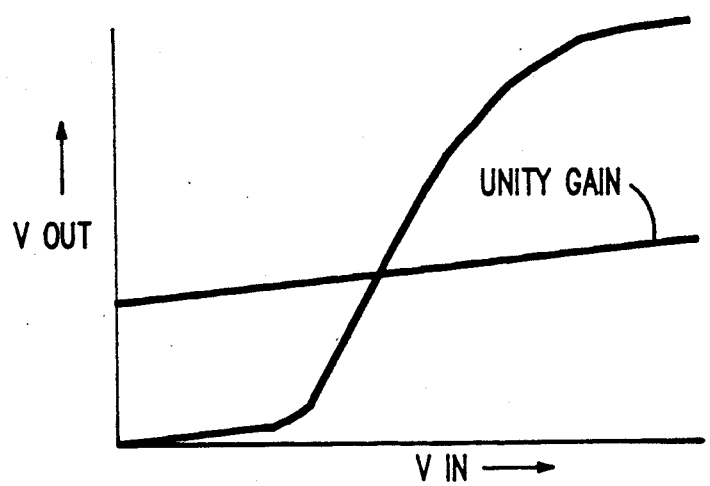
FIG. 8 (WITHOUT FEEDBACK)
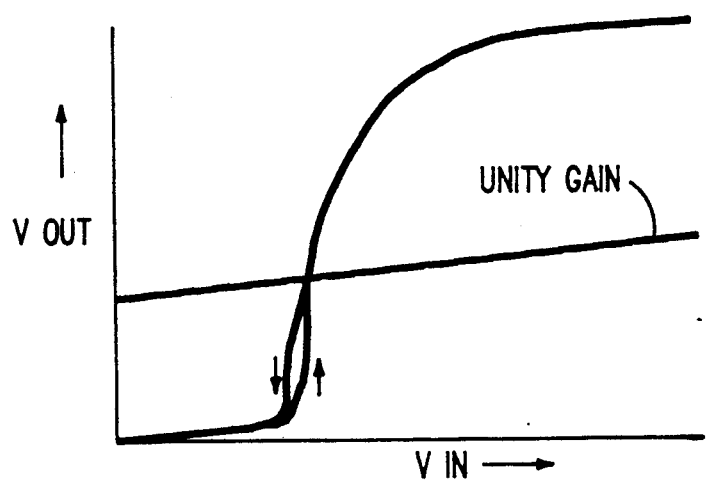
FIG. 9 (WITH SINGLE FEEDBACK)
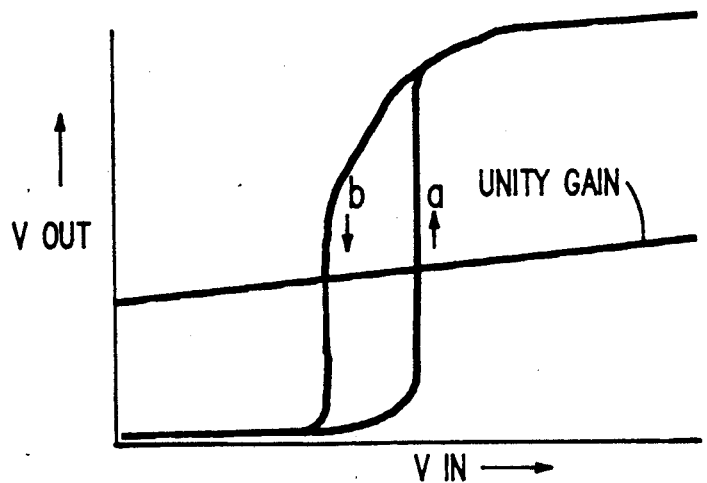
FIG. 10 (WITH DUAL FEEDBACK)

RECEIVER AND LEVEL CONVERTER CIRCUIT WITH DUAL FEEDBACK

DESCRIPTION

BACKGROUND OF THE INVENTION

1. Field of the Invention

The present invention relates to receiver and level converter circuits, and chips and systems employing such circuits. More particularly, the invention relates to a circuit for use in receiving a low-level signal, such as from a logic or memory circuit and converting such signal to a higher-level signal for output to another circuit.

2. Background and Description of the Related Art

The need for either a receiver circuit, or a level converter circuit, or both, may arise in several situations. One situation is where integrated circuit chips are physically separated by some distance, and signals traveling between them become attenuated because of line resistance, interference or other factors. It thus becomes necessary to include a receiver on one or both chips to restore the signal to its former level (i.e., provide high gain), in order to permit further processing to proceed.

Another situation, which requires a combined receiver and level converter device, arises when chips employing different technologies need to be interconnected. Logic and memory circuits, for example, may employ any of several technologies, including ECL (emitter-coupled logic), TTL (transistor-transistor logic), FET or CMOS (complementary metal-oxide semiconductor) and BICMOS (combined bipolar and CMOS transistors). Each technology normally operates with signals of different voltage levels, and different voltage swings between the "high" and "low" levels. A typical ECL signal may, for example, show a relatively small swing, such as 0.8 V or less. By contrast, a CMOS signal may show a larger swing of about 5.0 V. Because of this difference, interconnecting two circuits of different technologies thus normally requires at least one, and more often two, level converter circuits.

Regardless of the particular environment in which the receiver circuit is used, it is desirable to provide a circuit that not only provides high gain, but also is relatively immune to noise at the input (i.e., has high noise margin). "Noise" in this context could mean either random fluctuations in the input signals due, for example, to power supply or temperature variations, or it could mean differences in circuit device parameters due to variations in the processing of the semiconductor devices. Ideally, the receiver circuit should be able to tolerate all types of noise.

Various signal receiver and level converter circuits are known in the art. One example of a logic level conversion circuit which converts ECL logic levels to CMOS logic levels is that shown in U.S. Pat. No. 4,779,016. Here, a bipolar differential amplifier is coupled to a configuration of field effect transistors to accomplish the configuration of field effect transistors is shown in U.S. Pat. No. 4,453,095.

In another arrangement, U.S. Pat. No. 4,438,349 shows a CMOS differential amplifier for converting signals from one level to another. U.S. Pat. No. 3,988,595 and 4,782,251 also show circuits for converting signal levels.

The above prior art circuits, however, have a disadvantage in that either no feedback is provided between the output and the input of the differential amplifier, or only limited feedback is provided through one feedback loop. This limited feedback arrangement allows for noise at the input to have a relatively large effect on the signal at the output. The overall gain of the circuits also appears to be quite limited.

One way of increasing the gain as well as the noise margin for a difference amplifier receiver circuit is to introduce sufficient feedback to provide an output signal showing wide hysteresis in response to the input signal. Although hysteresis circuits have been developed, they have not typically utilized two feedback loops or have been employed in the context of a receiver or level converter circuit, particularly in an environment where a small level signal (such as ECL) must be converted to a larger level signal (such as CMOS or BICMOS), or where improved noise margin is desired.

SUMMARY OF THE INVENTION

The present invention is intended to remedy the above-mentioned disadvantages and provide a circuit capable of functioning as a signal receiver or a level converter circuit, or both, suitable for converting a low-level signal to a higher-level signal with high gain, large noise margin and with a minimum of delay. Several different embodiments are disclosed. A preferred embodiment includes a differential amplifier with two feedback loops to provide an output signal showing hysteresis characteristics, for increased gain, better noise margin and compensation. Each feedback loop includes a nonlinear difference network. In another embodiment, the differential amplifier has one feedback loop. All embodiments may be implemented in BICMOS technology, provide high gain, excellent noise margin and are suitable for converting ECL-level signals at the input to CMOS or BICMOS signals at the output.

More particularly, one embodiment of the present invention comprises a receiver comprising:

an input signal line;

a differential amplifier with at least first and second inputs and at least one output for generating an output signal;

first feedback means for receiving the output signal from the differential amplifier and a reference signal from a source, and for providing a first feedback signal to the first input of the differential amplifier, the first feedback signal being a function of the output signal and of the reference signal; and second feedback means for receiving the output signal from the differential amplifier and an input signal from the input signal line, for generating an inverted output signal, and for providing a second feedback signal to the second input of the differential amplifier, the second feedback signal being a function of the inverted output signal and of the input signal.

In another embodiment, the invention comprises an electrical interface system for coupling together integrated circuit chips of dissimilar technologies, comprising:

a first chip having circuit elements of one technological type and having means for transmitting data signals;

a second chip having circuit elements of a different technological type and having means for receiving such data signal;

the means for receiving such data signal comprising:

a differential amplifier with at least first and second inputs and at least one output for generating an output signal;

first feedback means for receiving the output signal from the differential amplifier and a reference signal from a source, and for providing a first feedback signal to the first input of the differential amplifier, the first feedback signal being a function of the output signal and of the reference signal; and second feedback means for receiving the output signal from the differential amplifier and the data signal from the first chip, for generating an inverted output signal, and for providing a second feedback signal to the second input of the differential amplifier, the second feedback signal being a function of the inverted output signal and of the data signal.

In still another embodiment, the invention comprises a memory chip for connection to an external circuit of a dissimilar technology, comprising:

a memory cell array; and a receiver circuit coupled to such array, comprising:

an input signal line;

a differential amplifier with at least first and second inputs and at least one output for generating an output signal;

first feedback means for receiving the output signal from the differential amplifier and a reference signal from a source, and for providing a first feedback signal to the first input of the differential amplifier, the second feedback signal being a function of the inverted output signal and of the input signal.

In yet another embodiment, the present invention comprises a dual feedback receiver and level converter circuit comprising:

a differential amplifier circuit having first and second inputs for receiving first and second feedback signals and an output for producing an output signal;

a signal amplifier circuit having first and second inputs and an output, the first input being coupled to the output of the differential amplifier for receiving the output signal, the second input being arranged to receive an inverted output signal and the signal amplifier output being arranged to produce an amplified output signal;

a phase inverter circuit having an input and an output, the input being coupled to the output of the differential amplifier for receiving the output signal, the output being coupled to the second input of the signal amplifier, the inverter being arranged to produce the inverted output signal at its output;

a first feedback circuit comprising a first difference circuit having first and second inputs and an output, the first input being coupled to a constant signal source and arranged to receive a constant reference signal, the second input being coupled to the output of the differential amplifier for receiving the output signal, and the output of the first feedback circuit being coupled to the first input of circuit being arranged to produce the first feedback signal at its output, the first feedback signal comprising the reference signal minus a nonlinear function of the output signal;

a second feedback circuit comprising a second difference circuit having first and second inputs and an output, the first input being coupled to the input signal line for receiving a variable input signal from such line, the second input being coupled to the output of the inverter for receiving the inverted output signal, the second difference circuit being arranged to produce the second feedback signal at its output, the second feedback signal comprising the input signal minus a nonlinear function of the inverted output signal; and a clamping circuit coupled to the output of the differential amplifier for preventing the output signal from exceeding a predetermined level;

whereby the amplified output signal is an amplified version of the variable input signal.

Other variations and embodiments of the invention are also disclosed, and are discussed more fully in the detailed description below.

BRIEF DESCRIPTION OF THE DRAWINGS

To facilitate further description of the invention, the following drawings are provided in which:

FIG. 6 is a schematic circuit diagram of another embodiment of the present invention, showing a single feedback loop.

FIG. 7 is a schematic circuit diagram of the embodiment of FIG. 6, with the feedback loop removed.

FIG. 8 is a graph of the transfer curve (voltage response curve) of the circuit of FIG. 7.

FIG. 9 is a graph of the transfer curve (voltage response curve) of the circuit of FIG. 6.

FIG. 10 is a graph of the transfer curve (voltage response curve) of the circuit of FIG. 5.

DETAILED DESCRIPTION OF THE PREFERRED EMBODIMENTS

Figure 1:
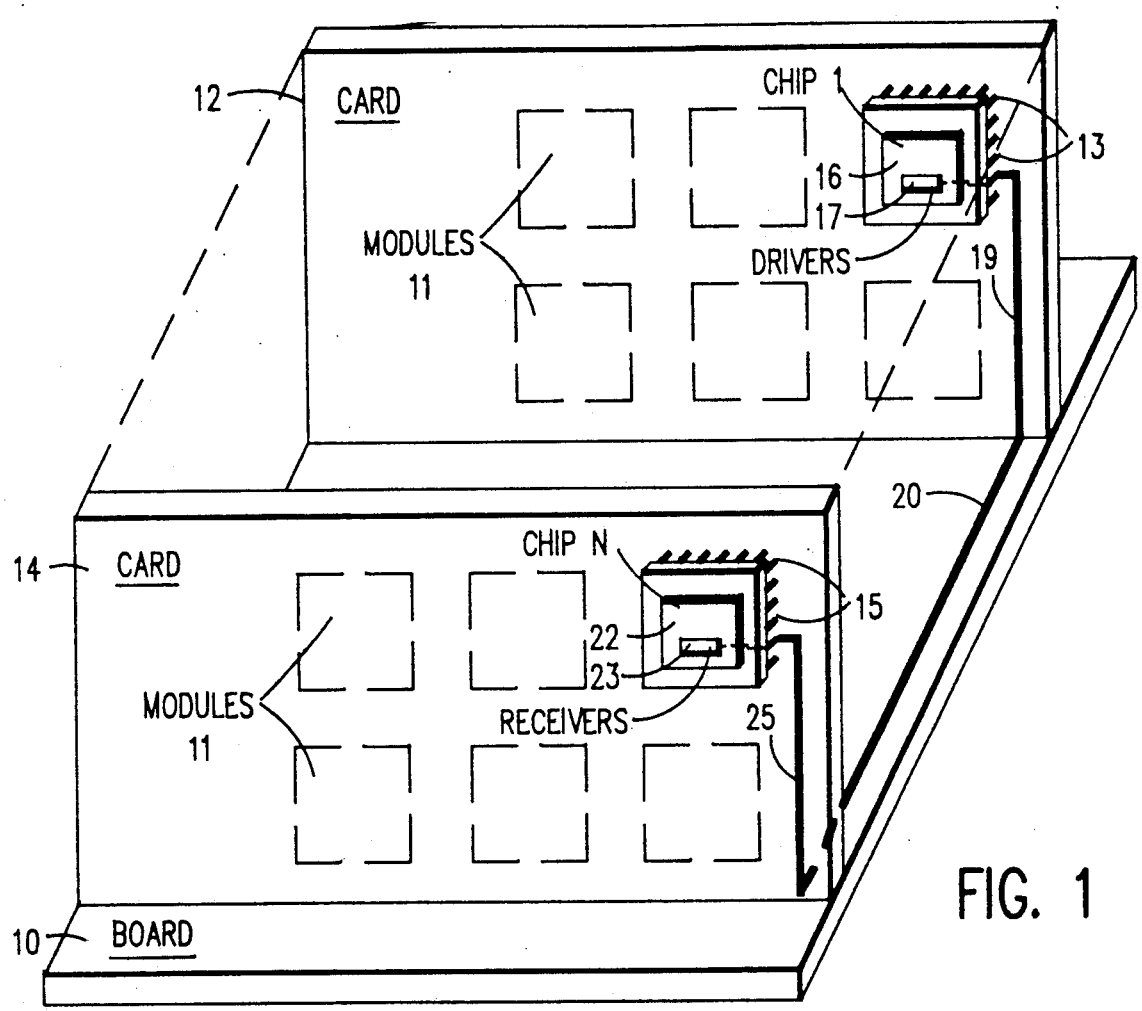
FIG. 1 is a pictorial diagram showing one overall environment in which the present invention may find application.

Referring now to FIG. 1, there shown therein a pictorial diagram of an overall environment in which the present invention may find application. The present invention is not, however, limited to this particular application or to the application or configuration shown in any other drawing.

FIG. 1 shows a board 10, such as an electrical mounting board, on which are mounted a plurality of cards 12, 14. Each card, in turn, supports a plurality of modules 11 carrying one or more integrated circuit chips 16 ("chip 1"), and 22 ("chip N"). In this general configuration, which is common in the data processing industry, it can be seen that chip 1 is separated from chip N by some physical distance. And because of the complex wiring patterns that may be required for interconnection between chips, such as that shown by line 20, connected between pins 13 and 15, a signal must travel a relatively long distance between chips 1 and N. To compensate for transmission losses arising from such a long distance, signal drivers 17 may be provided on chip 1, and receivers 23 may be provided on chip N. The present invention may be used quite effectively as one or more of these receivers 23.

Figure 2:
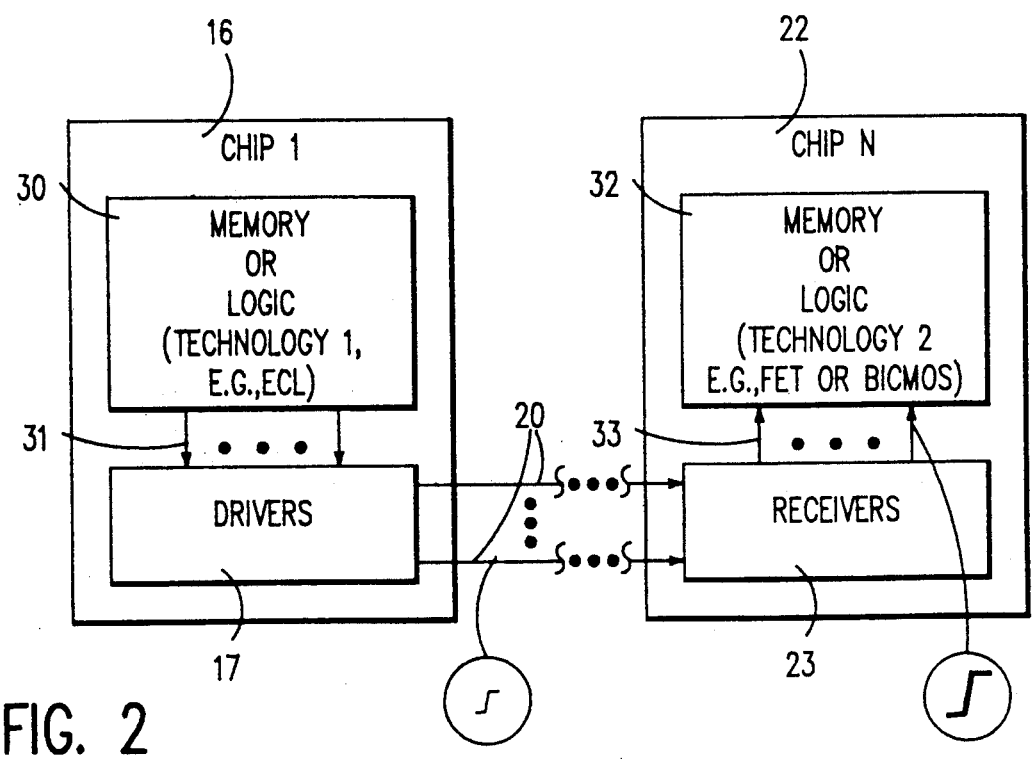
FIG. 2 is a block diagram showing another environment in which the invention may find application.

FIG. 2 shows another environment in which the present invention may find useful application. Here, as in FIG. 1, chip 1 is shown connected to chip N via lines 20. In this case, chip 1 contains memory or logic circuits using a certain technology, such as ECL. It also contains a plurality of drivers 17 which serve to couple the memory or logic circuits to the lines 20 for transmission of signals, which may comprise binary data words. The signals have a small swing, as shown by the circular pictorial representation. Chip N contains memory or logic circuits using a second technology, such as FET (CMOS) or BICMOS.

Since BICMOS circuits normally require larger-swing signals than ECL signals for proper operation, receivers 23 should be provided to increase the level, as shown by the pictorial representation. The receiver of the present invention is configured to operate as one of these receivers 23.

Figure 3:
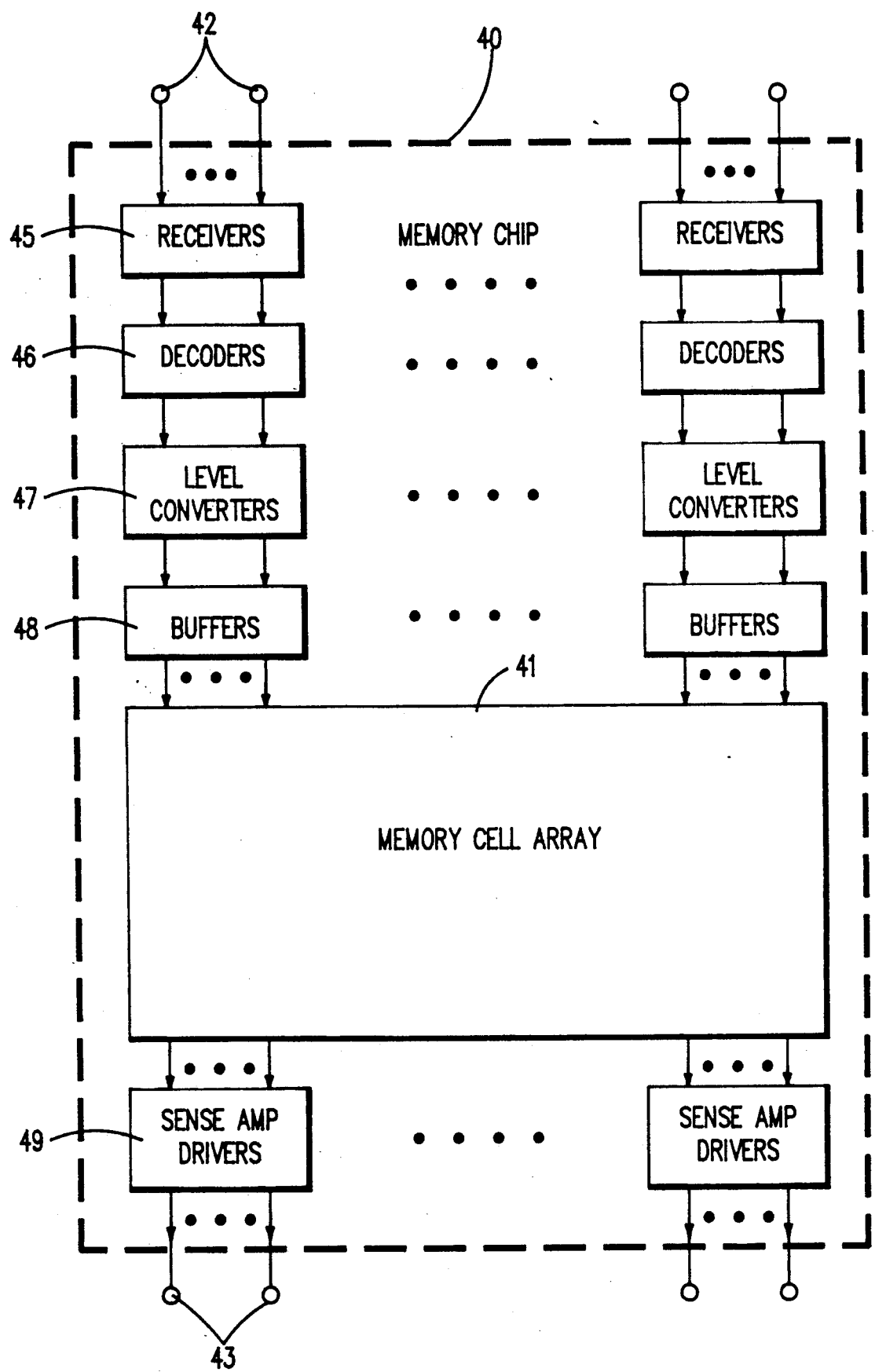
FIG. 3 is a block diagram of one example of the application of FIG. 2.

A third environment showing the use of both receivers and level converters is given in FIG. 3. Here, a memory chip 40 is provided with a plurality of input terminals 42 for receiving data signals to be stored in a memory cell array 41. Before storage, however, the signals generally must be boosted in strength by receivers 45, decoded by decoders 46, converted by level converters 47 and perhaps further processed or buffered by buffers 48. Receivers 45 would be needed in the event the input data signals are relatively weak. Level converters 47 would also be needed in the event the external circuitry attached to terminals 42, or the decoders 46, used a different technology than the buffers 48 or memory cell array 41. The present invention could be used either for the receivers 45, the converters 47, or for both devices, in this type of representative application.

Figure 4:
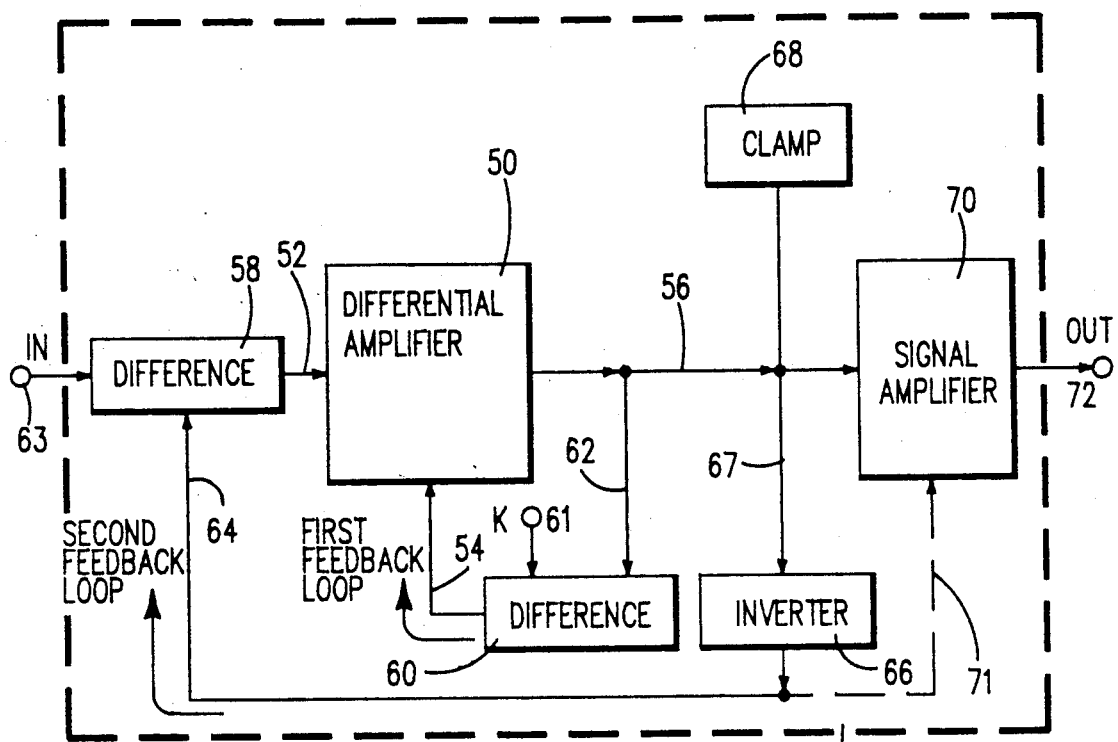
FIG. 4 is a block diagram of one embodiment of the present invention, showing dual feedback loops.

A functional block diagram of a preferred embodiment of the present invention is shown in FIG. 4. A differential amplifier 50, which may be a current switch circuit, has two inputs 52, 54 and one active output 56. Although conventional current switch circuits typically have both standard and complementary outputs, the complementary output of current switch 50 need not be used in this configuration. Current switch 50 operates as a conventional differential amplifier, receiving input signals over inputs 52 and 54 and generating an output signal over output 56 in response thereto.

Coupled between the output 56 and input 54 of the current switch is a first difference network 60, which has two inputs 61, 62 and one output 54. Input 62 is coupled to the output 56 of the current switch 50, input 61 is coupled to a signal source K, and output 4 is the same as input 54 of current switch 50. This arrangement results in a first feedback loop from output 56, to input 62, to difference network 60, to output 54 and back to the current switch. Difference network 60 is configured to produce a first feedback signal at its output 54 that equals signal K minus a nonlinear function (described below) of the output signal at the current switch output 56.

Coupled between the output 56 and input 52 of the current switch is a second feedback loop, which in the preferred embodiment comprises inverter 66 coupled to a second difference network 58. Inverter 66 is a conventional signal phase inverter with one input 67 and one output 64 for producing an inverted output signal. Difference network 58 has two inputs 63, 64 and one output 52. Input 64 is the same as the output of the inverter 66, and output 52 is the same as input 52 of current switch 50. Difference network input 63 is arranged to receive an input signal from external circuitry. Difference network 58 is configured to produce a second feedback signal at its output 52 that equals the input signal on line 63 minus a nonlinear function (described below) of the inverted output signal at the inverter output 64.

To complete the block diagram description of the invention in FIG. 4, an amplifier 70 is coupled to output 56 of current switch 50, for producing an amplified output signal at an output 72. An optional clamp 68 may also be coupled to current switch output 56 to limit the signal level at the current switch output, if desired. Amplifier 70 may have either one or two inputs, the second input being shown as dashed line 71 from inverter 66. This second input may be used to receive the inverted output signal from the inverter for increased amplification.

Figure 5:
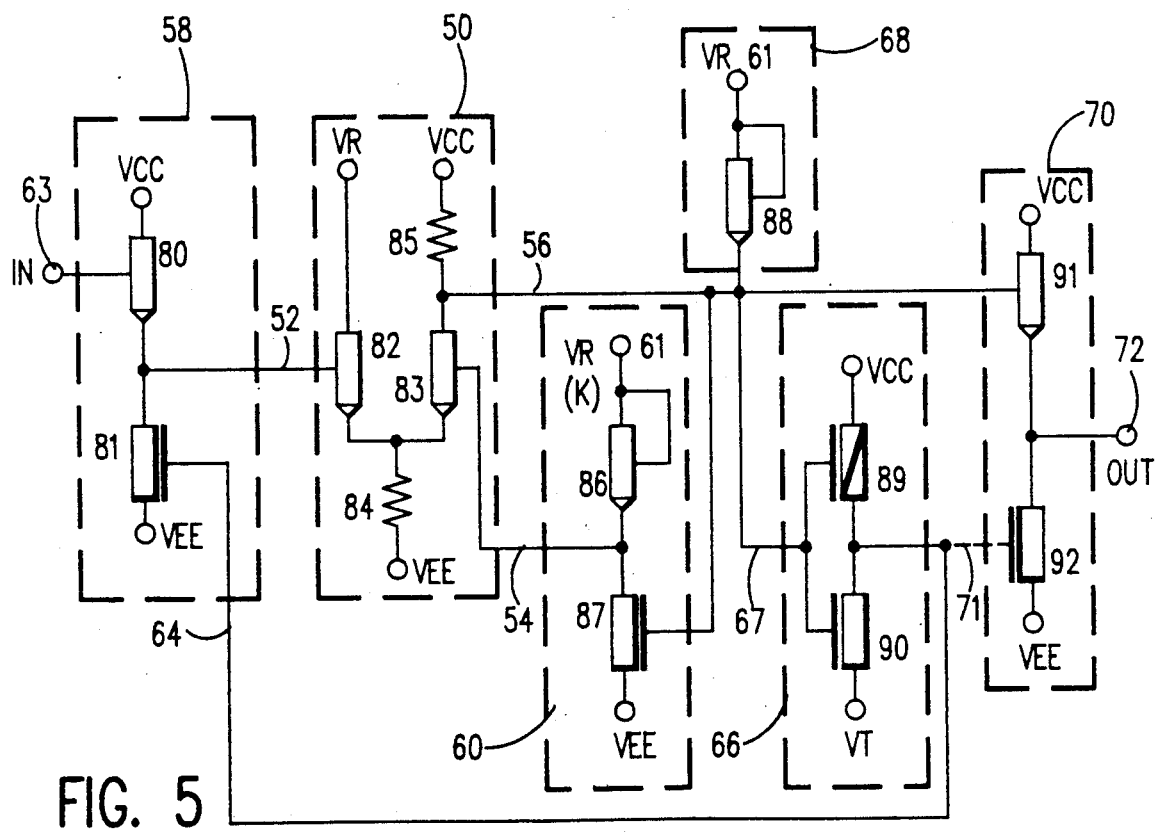
FIG. 5 is a schematic circuit diagram of one embodiment of FIG. 4.

A specific embodiment of the circuit of FIG. 4 is shown in FIG. 5, with dashed lines representing the functional blocks of FIG. 4. Here, differential amplifier (current switch) 50 comprises two transistors 82, 83 and two resistors 84, 85. In the preferred embodiment, transistors 82 and 83 are of the bipolar NPN type, and have their emitters coupled together and to resistor 84, the other end of this resistor being coupled to a voltage source $V_{EE}$. The collector of transistor 83 is coupled to resistor 85, the other end of this resistor being coupled to another voltage source $V_{CC}$, and the collector of transistor 82 being coupled to a third voltage source $V_R$. The base of transistor 82 receives current switch input 52, and the base of transistor 83 receives current switch input 54. Current switch output 56 is taken from the collector of transistor 83.

The first difference network 60, in the preferred embodiment of FIG. 5, comprises an NPN bipolar transistor 86 and an N-channel FET 87. The collector and base of transistor 86 are coupled together and to voltage source $V_R$ at input terminal 61, source $V_R$ comprising the constant signal source K. The emitter of transistor 86 is coupled to output line 54 and to the drain of FET 87. The source of FET 87 is coupled to voltage source $V_{EE}$ and the gate is coupled to current switch output 56. Thus, it can be seen that a first feedback loop is created between output 56 and input 54 of the current switch.

The second feedback loop, as noted, comprises inverter 66 in series with second difference network 58. Inverter 66 is a conventional CMOS inverter comprised of a P-channel FET 89 and an N-channel FET 90 with their drains coupled together in series. The source of FET 89 is coupled to the voltage source $V_{CC}$ and the source of FET 90 is coupled to another voltage source $V_T$. The gates of FETs 89 and 90, which receive the input to the inverter, are coupled together and via input line 67 to the current switch output 56. The output 64 of the inverter is taken from the common drain connection of FETs 89 and 90.

Second difference network 58 (FIG. 5) is similar to first difference network 60 in that it comprises an NPN bipolar transistor 80 having its emitter coupled to the drain of an N-channel FET 81. The source of FET 81 is coupled to voltage source $V_{EE}$, but, unlike difference network 60, transistor 80 has its collector coupled to $V_{CC}$ and its base coupled to input 63. The other input 64 of difference network 58 is coupled to the gate of FET 81, and the output 52 is taken from the emitter of transistor 80.

In the preferred embodiment of FIG. 5, amplifier 70 comprises an NPN bipolar transistor 91 coupled to an N-channel FET 92 in a push-pull configuration. The collector of transistor 91 is coupled to voltage source $V_{CC}$, the base is coupled to current switch output 56 and the emitter is coupled to the drain of FET 92. The source of FET 92 is coupled to voltage source $V_{EE}$ and the gate is coupled via line 71 to the output of inverter 66. Thus, in this arrangement, amplifier 70 has two inputs, one for receiving the output signal from the current switch and one for receiving the inverted output signal from the inverter. The amplifier output 72 is taken from the emitter of transistor 91.

Finally, clamp 68, which is optional, comprises an NPN bipolar transistor 88 having its emitter coupled to current switch output 56 and having its base and emitter coupled together and to voltage source 61, $V_R$.

As described above, first difference network 60, which includes transistors 86 and 87, produces a first feedback signal, $V_{54}$, at its output that is equal to signal K minus a nonlinear function of the current switch output signal, $V_{56}$. More specifically, and referring to FIG. 5, the value of $V_{54}$ may be given by the following equation:

$$V_{54} = K - f_1 (f_2 (V_{56})),$$

where K is voltage $V_R$; $f_1$ is the transfer curve (output versus input) of transistor 86 which determines the $V_{BE}$ of transistor 86 as a function of the emitter current; and $f_2$ is the transfer curve of transistor 87, which determines the drain current of transistor 87 as a function of $V_{56}$.

Second difference network 58, which includes transistors 80 and 81, produces a second feedback signal, $V_{52}$, at its output that is equal to the input signal, $V_{in}$ or $V_{63}$, minus a nonlinear function of the inverted current switch output signal, $V_{64}$. More specifically, and referring to FIG. 5, the value of $V_{52}$ may be given by the following equation:

$$V_{52} = V_{in} - f_3 (f_4 (V_{64})),$$

where $V_{in}$ is input voltage $V_{63}$; $f_3$ is the transfer curve of transistor 80, which determines the $V_{BE}$ of transistor 80 as a function of the emitter current; and $f_4$ is the transfer curve of transistor 81, which determines the drain current of transistor 81 as a function of $V_{64}$.

More specific definitions of the functions $f_1$, $f_2$, $f_3$ and $f_4$ may be given as follows:

$$f_2(V_{56}) = I_{SD87} = \frac{\mu \epsilon W}{2LD} (V_{56} - V_{th87})^2,$$

where $I_{SD87}$ is the source-drain current through transistor 87; $\mu$ is the electron mobility; $\epsilon$ is the permittivity; W is the channel width; L is the channel length, D is the oxide thickness; and $V_{th87}$ is the threshold voltage (all of transistor 87).

$$f_1(f_2(V_{56})) = V_{BE86} = \frac{kT}{q} \times \ln(I_{SD87} + I_{54}),$$

where $V_{BE86}$ emitter voltage drop of transistor 86; k is the Boltzmann Constant ($1.38 \times 10^{-23}$ J/° k); T is temperature in ° k; q is electronic charge ($1.6 \times 10^{-19}$ C); $I_{S87}$ is the source-drain current in transistor 87; and $I_{54}$ is the current in output line 54 (which is the same as the base current in transistor 83).

$$f_4(V_{64}) = I_{SD81} = \frac{\mu \epsilon W}{2LD} (V_{64} - V_{th81})^2,$$

where $I_{SD81}$ is the source-drain current through transistor 81; $\mu$ is electron mobility; $\epsilon$ is permittivity; W is channel width; L is channel length; D is oxide thickness; and $V_{th81}$ is threshold voltage (all of transistor 81).

$$f_3(f_4(V_{64})) = V_{BE80} = \frac{kT}{q} \times \ln(I_{SD81} + I_{52}),$$

where $V_{BE80}$ is the base to emitter voltage drop of transistor 80; k is the Boltzmann Constant; T is temperature; q is electronic charge; $I_{SD81}$ is the source-drain current in transistor 81; and $I_{52}$ is the current in output line 52 (which is the same as the base current in transistor 82).

In order to better understand how the circuits of the present invention operate, it is instructive to first examine the transfer characteristics of current switch circuit without feedback. FIG. 7 displays such a circuit, and FIG. 8 shows its transfer curve (i.e., the output voltage, $V_{out}$ as a function of the input voltage, $V_{in}$) The circuit of FIG. 7 may, for example, convert an input signal ($V_{in}$) at terminal 63 having a swing of 0.2 V to an output signal ($V_{out}$), at terminal 72, having a swing of 2.2 V.

As shown in FIG. 8, the transfer curve has a low gain, as shown by the relatively gradual rise in $V_{out}$ as $V_{in}$ increases. Looked at another way, the transition region of $V_{out}$ is relatively wide. When $V_{out}$ reaches the steady state region for the "high" state, it is still subject to change based upon changes in $V_{in}$. If parameters of the devices in FIG. 7 were to change based upon process or environmental variations (i.e., noise), $V_{out}$ could be adversely affected, perhaps to the point of preventing a sufficient "high" level of $V_{out}$ from being achieved in response to the corresponding "high" level for $V_{in}$, thus preventing proper operation of the device.

Better noise margin is achieved if feedback is introduced into the circuit to increase gain. FIG. 6 illustrates a change whereby a single feedback loop is introduced into the circuit of FIG. 7. This loop is formed by the path from output line 56, into the gate of transistor 87, out of the drain of transistor 87 and into the base of transistor 83. The corresponding transfer curve for this circuit is shown in FIG. 9, and it can be seen that, as compared with FIG. 8, the transfer curve is steeper and reaches steady state more quickly than it does in the curve of FIG. 8. This means that the gain has been increased and the down-going noise margin has been improved.

The operation of the circuit in FIG. 6 will now be described. The N channel pull down transistor 87 is used to vary the reference voltage at the base of transistor 83 (node 54) in the opposite direction to the movement on the base of transistor 82 (input 52), thereby increasing the differential input voltage to the current switch 50 ($V_{52}$-$V_{54}$), which is desirable. The gate voltage at transistor 87 is out of phase with the emitter voltage ($V_{54}$) at transistor 86. Transistor 86 operates as a level-shifting diode (similar to a level shifting emitter follower), and is used to generate a reference voltage at the base of transistor 83 with a value of one $V_{be}$ drop below VR which may, for example, be the ground potential. This reference voltage will therefore be centered at the voltage midpoint at input 52.

Still greater gain and noise margin is achieved if a second feedback loop is introduced. In particular, it has been discovered that a second feedback loop may be added to increase the gain and also add hysteresis to the circuit. As shown in FIG. 5, this second feedback loop, formed from inverter 66 and difference network 58, utilizes an N-channel pull-down FET 81 coupled to the input emitter follower transistor 80 to shift the input levels ($V_{in}$) down by one $V_{be}$ drop. The gate of this FET receives its feedback signal from the output of a CMOS inverter 66 whose input is driven by the in phase output (line 56) of the current switch 50 so the signal at the gate of transistor 81 is out of phase with the signal at the emitter of transistor 80.

FIG. 10 shows the transfer curve for FIG. 5, and it can be seen that, as compared with FIG. 9, the gain has been increased and the noise margin (especially the upgoing noise margin) has been improved still further. The transfer curve is steeper and reaches steady state more quickly than the transfer curves of FIGS. 8 or 9, and significant hysteresis is also present, meaning that increased noise margin is achieved for both the upgoing transition and the downgoing transition. In this embodiment, the output voltage ($V_{out}$) has two values, depending upon the direction of input voltage ($V_{in}$) change. The path labelled "a" is followed when $V_{in}$ changes from "low" to "high" and the path labelled "b" is followed when $V_{in}$ changes from "high" to "low." Because the transition region is further from the steady state region for both paths, as compared with circuits with no feedback, variations in input signals will have relatively little effect on the output signal.

The following is a description of the operation of the circuit of FIGS. 4 and 5. (Also refer to FIG. 10 for transfer curve visualization.) Since this circuit is a logic circuit, the operation will be divided into 3 cases:

(A) a dc steady state output at the "1" or "high" output state;

(B) a dc steady state output at the "0" or "low" output state; and (C) the transition region:
  (1) from a "0" to a "1" state; and
  (2) from a "1" to a "0" state.

In cases (A) and (B), the effect of the feedback loops is negligible because the gain of the current switch SO is equal to 0 for small changes in input voltage far from the transition region. For case (C), the effect of the two feedback loops is large in the region where the output voltage is in the middle of its transition between a "0" and a "1" level.

CASE (A): Output (and Input) at High Level

Assume first that the signal at input 63 is at a high state, which then causes current switch input 52 to be at a high state. Input 52 will have a higher voltage level than current switch input 54, therefore causing transistor 82 to turn on and transistor 83 to turn off. Since transistor 83 is off, current switch output 56 rises to $V_{CC}$, causing the output at terminal 72 to be high. As stated above, the feedback loops have no effect for small changes in input voltage from the dc high level far from the transition region because the differential amplifier has 0 small signal gain. FIG. 10 illustrates the low small signal gain for high values of VIN.

CASE (B): Output (and Input) at Low Level

Assume next that input 63 is at a low state, which then causes current switch input 52 to be at a low state. Input 52 will have a lower voltage level than current switch input 54, therefore causing transistor 82 to turn off and transistor 83 to turn on. Since transistor 83 is on, current switch output 56 falls to a low level controlled by clamp network 68, causing the output at terminal 72 to be low. As stated above, the feedback loops have no effect for small changes in input voltage from the dc low level because the differential amplifier has 0 small signal gain. FIG. 10 illustrates the low small signal gain for Low values of VIN.

CASE (C): Transition Region

Since the circuit of FIGS. 4 and 5 has hysteresis, the absolute value of VIN is not sufficient to determine the value of the output voltage, VOUT. The value of the output voltage depends on the previous value of VIN or in other words the direction of change of VIN. Refer to FIG. 10 for a diagram of the hysteresis effect. Case (1) below corresponds to the region of the transfer curve labelled "a" and case (2) refers to the region labelled "b".

1) Input Changing from "0" to "1".

The output of the differential amplifier 50 is a function of the voltage differential between inputs 52 and 54. The voltage at input 54 is a function of the voltage at output 56. Since the voltage at output 56 is low due to the low input voltage, the voltage at input 54 is at its highest value. This high value at input 54 means the input voltage (VIN), and hence $V_{52}$, has to go to a higher value to turn on transistor 82 and turn off transistor 83. This is the reason the curve, labelled "a" is shifted to the right (higher values of VIN).

A small increase in VIN decreases the current slightly in transistor 83, causing a small increase in the voltage at current switch output 56 and thereby a small increase in output voltage, VOUT.

The effect of the feedback loops will now be further described and will be shown to increase the gain and noise margin of the entire circuit (see FIGS. 4 and 5). The second feedback loop, containing inverter 66, will be considered first. As the voltage at output 56 increases, the voltage at the output 64 of the inverter decreases, which reduces the gate voltage on transistor 81, thereby decreasing its drain current. This decrease in drain current, which is the same as the emitter current in transistor 80, causes a decrease in the base to emitter voltage of transistor 80, and therefore increases the voltage at current switch input 52. The increase in this voltage, in turn, causes the voltage at current switch output 56 to rise, thereby reinforcing the original assumed increase at output 56.

Next consider the first feedback loop containing difference network 60. Again, as output voltage 56 increases, the gate voltage of transistor 87 increases and the emitter current of transistor 86 increases, thereby increasing the base to emitter voltage of 86 which decreases the voltage at input 54. Therefore transistor 83 turns off further causing output 56 to rise further. This reinforces the original assumed voltage increase at output 56 and the feedback is therefore positive. Thus, both loops have positive feedback thereby increasing the total network gain and noise margin. As can be seen, the curve labelled "a" in FIG. 10 has a very large slope.

2) Input Changing from "1" to "0"

The analysis is similar to the case above (input changing from "0" to "1") but in the opposite sense. In this instance, the transfer curve of FIG. 10 follows the "b" path as $V_{in}$ changes from high to low.

Hysteresis provided by the two feedback loops increases the noise margin because $V_{in}$ must travel further from the steady state level on the upgoing curve ("a") before $V_{out}$ will switch, and vice versa for the downgoing curve ("b"). The circuit is still able to handle small signal swings at the input because the hysteresis provides two different reference levels for differential amplifier 50, each of which may be close to its corresponding steady state level.

Because of the increased noise margin, and high gain, the present invention can handle very low input signal swings over relatively large process and temperature variations. The invention can also handle high input signal swings, if necessary, because transistors 82 and 83 (FIG. 5) will not saturate from large input signals.

While the invention has been particularly shown and described with reference to the preferred embodiments, it will be understood by those skilled in the art that various changes in form and detail may be made therein without departing from the spirit and scope of the invention.

We claim:

1. A receiver comprising:
   an input signal line;
   a differential amplifier with at least first and second inputs and at least one output for generating an output signal;
   a first feedback means for receiving the output signal from the differential amplifier and a reference signal from a source, and for providing a first feedback signal to the first input of the differential amplifier, the first feedback means having a first difference network coupled between the output and the first input of the differential amplifier, and arranged such that the first feedback signal comprises the reference signal minus a first nonlinear function of the output signal; and
   second feedback means for receiving the output signal from the differential amplifier and an input signal from the input signal line, and for providing a second feedback signal to the second input of the differential amplifier, the second feedback means having an inverter and a second difference network coupled in series between the output and the second input of the differential amplifier, and arranged such that the second feedback signal comprises the input signal minus a second nonlinear function of the output signal.

2. The receiver of claim 1 further including a signal amplifier coupled to the output of the differential amplifier, output signal.

3. The receiver of claim 1 further including a signal amplifier having first and second inputs and one output, the first input coupled to the output of the differential amplifier, the second input coupled to the output of the inverter, the signal amplifier arranged to generate an amplified output signal at its output.

4. The receiver of claim 2 further including a clamp coupled to the output of the differential amplifier for preventing the output signal from exceeding a predetermined level.

5. An electrical interface system for coupling together integrated circuit chips of dissimilar technologies, comprising:
   a first chip having circuit elements of one technological type and having means for transmitting a data signal;
   a second chip having circuit elements of a different technological type and having means for receiving such data signal;
   the means for receiving such data signal comprising:
   a differential amplifier with at least first and second inputs and at least one output for generating an output signal for input to other circuits on the second chip;
   first feedback means for receiving the output signal from the differential amplifier and a reference signal from a source, and for providing a first feedback signal to the first input of the differential amplifier, the first feedback signal being a function of the output signal and of the reference signal; and
   second feedback means for receiving the output signal from the differential amplifier, the second feedback signal being a function of the output signal and of the data signal.

6. The system of claim 5 wherein:
   the first feedback means comprises a first difference network coupled between the output and the first input of the differential amplifier, and arranged such that the first feedback signal comprises the reference signal minus a first nonlinear function of the output signal; and
   the second feedback means comprises an inverter and a second difference network coupled in series between the output and the second input of the differential amplifier, and arranged such that the second feedback signal comprises the data signal minus a second nonlinear function of the output signal.

7. A memory chip for connection to an external circuit of a dissimilar technology, comprising:
   a memory cell array; and a receiver circuit coupled to such array, comprising: an input signal line;
   a differential amplifier with at least first and second inputs and at least one output for generating an output signal for transmittal to the memory cell array;
   first feedback means for receiving the output signal from the differential amplifier and a reference signal from a source, and for providing a first feedback signal to the first input of the differential amplifier, the first feedback signal being a function of the output signal and of the reference signal; and
   second feedback means for receiving the output signal from the differential amplifier and an input signal from the input signal line, and for providing a second feedback signal to the second input of the differential amplifier, the second feedback signal being a function of the output signal and of the input signal.

8. The memory chip of claim 7 wherein:
   the first feedback means comprises a first difference network coupled between the output and the first input of the differential amplifier, and arranged such that the first feedback signal comprises the reference signal minus a first nonlinear function of the output signal; and
   the second feedback means comprises an inverter and a second difference network coupled in series between the output and the second input of the differential amplifier, and arranged such that the second feedback signal comprises the input signal minus a second nonlinear function of the output signal.

9. A dual feedback receiver and level converter circuit comprising:
   an input signal line;
   a differential amplifier circuit having first and second inputs for receiving first and second feedback signals and an output for producing an output signal;
   a signal amplifier circuit having first and second inputs and an output, the first input being coupled to the output of the differential amplifier for receiving the output signal, the second input being arranged to receive an inverted output signal and the signal amplifier output being arranged to produce an amplified output signal; output, the input being coupled to the output of the differential amplifier for receiving the output signal, the output being coupled to the second input of the signal amplifier, the inverter being arranged to produce the inverted output signal at its output;

a first feedback circuit comprising a first difference circuit having first and second inputs and an output, the first input being coupled to a constant signal source and arranged to receive a constant reference signal, the second input being coupled to the output of the differential amplifier for receiving the output signal, and the output of the first feedback circuit being coupled to the first input of the differential amplifier, the first difference circuit being arranged to produce the first feedback signal at its output, the first feedback signal comprising the reference signal minus a nonlinear function of the output signal;

a second feedback circuit comprising a second difference circuit having first and second inputs and an output, the first input being coupled to the input signal line for receiving a variable input signal from such line, the second input being coupled to the output of the inverter for receiving the inverted output signal, the second difference circuit being arranged to produce the second feedback signal at its output, the second feedback signal comprising the input signal minus a nonlinear function of the inverted output signal; and a clamping circuit coupled to the output of the differential amplifier for preventing the output signal from exceeding a predetermined level;

whereby the amplified output signal is an amplified version of the variable input signal.

10. The circuit of claim 9 wherein the input signal is of the ECL level and the output signal is of the CMOS or BICMOS level.

11. The circuit of claim 9 wherein the differential amplifier circuit comprises first and second bipolar transistors having their emitters coupled together and through a first resistance to a first voltage source, the collector of the first bipolar transistor being arranged to produce the output signal and being coupled through a second resistance to a second voltage source, and the collector of the second bipolar transistor being coupled to a third voltage source, the base of the first bipolar transistor being arranged to receive the first feedback signal, and the base of the second bipolar transistor being arranged to receive the second feedback signal.

12. The circuit of claim 9 wherein the first difference circuit comprises a bipolar transistor having its base and collector coupled together and its collector-emitter path coupled in series with the source-drain path of an FET, such paths being coupled between first and second voltage-sources, the gate of the FET being arranged to receive the output signal from the differential amplifier, the first voltage source comprising the source of the reference signal, and the connection point between the bipolar transistor and the FET being arranged to provide the first feedback signal to the first input of the differential amplifier.

13. The circuit of claim 9 wherein the second difference circuit comprises a bipolar transistor having its collector-emitter path coupled in series with the source-drain path of an FET, such paths being coupled between first and second voltage sources, the base of the bipolar transistor being arranged to receive the input signal from the input signal line, the gate of the FET being arranged to receive the inverted output signal, and the connection point between the bipolar transistor and the FET being arranged to provide the second feedback signal to the second input of the differential amplifier.

14. The circuit of claim 9 wherein the signal amplifier circuit comprises a bipolar transistor having its collector-emitter path coupled in series with the source-drain path of an FET, such paths being coupled between first and second voltage sources, the base of the bipolar transistor comprising the first signal amplifier input, the gate of the FET comprising the second signal amplifier input, and the connection point between the bipolar transistor and the FET comprising the signal amplifier output.

15. The circuit of claim 9 wherein the clamping circuit comprises a bipolar transistor having its emitter coupled to the output of the differential amplifier and its base and collector coupled together and to a voltage source.

16. A BICMOS dual feedback emitter follower receiver and level converter circuit, for converting an ECL-level signal to a CMOS or BICMOS-level signal, comprising:

an input terminal and an output terminal;

first, second, third and fourth voltage terminals;

a first bipolar transistor, having its base connected to the input terminal and its collector-emitter path connected in series with the first voltage terminal, a first node, the source-drain path of a first FET, and the second voltage terminal;

second and third bipolar transistors, having their emitters connected in common and then through a first resistor to the second voltage terminal, the collector of the second bipolar transistor being connected to the third voltage terminal, the base of the second bipolar transistor being connected to the first node, the collector of the third bipolar transistor being connected to a second node and the base of the third bipolar transistor being connected to a third node, a second resistor being connected between the first voltage terminal and the second node;

a fourth bipolar transistor, having its collector and base connected together and to the third voltage terminal and having its emitter connected in series with the third node, the source-drain path of a second FET and the second voltage terminal, the gate of the second FET being connected to the second node;

a fifth bipolar transistor, having its collector and base connected together and to the third voltage terminal and having its emitter connected to the second node;

fourth and fifth FETs of complementary types, having their source-drain paths connected in series between the first voltage terminal, a fourth node and the fourth voltage terminal, and having their gates connected together and to the second node, the fourth node being connected to the gate of the first FET; and a sixth bipolar transistor, having its collector connected to the first voltage terminal, its base connected to the second node and its emitter connected to the output terminal and to the drain of a third FET, the third FET having its source connected to the second voltage terminal and its gate connected to the fourth node;

the receiver and level converter circuit being configured to convert ECL-level signals at the input terminal to CMOS or BICMOS-level signals at the output terminal.

17. A BICMOS single-feedback emitter follower receiver and level converter circuit, for converting an ECL-level signal to a CMOS or BICMOS-level signal, comprising:

an input terminal and an output terminal;

first, second and third voltage terminals;

a first bipolar transistor, having its collector-emitter path connected in series with the first voltage terminal, a first node, the source-drain path of a first FET, and the second voltage terminal, and having its base connected to the input terminal, the gate of the first FET being connected to the first node;

second and third bipolar transistors, having their emitters connected in common and then through a first resistor to the second voltage terminal, the collector of the second bipolar transistor being connected to the third voltage terminal, the base of the second bipolar transistor being connected to the first node, the collector of the third bipolar transistor being connected to a second node and the base of the third bipolar transistor being connected to a third node, a second resistor being connected between the first voltage terminal and the second node;

a fourth bipolar transistor, having its collector and base connected together and to the third voltage terminal and having its emitter connected in series with the third code the source-drain path of a second FET and the second voltage terminal, the gate of the second FET being connected to the second node;

a fifth bipolar transistor, having its collector and base connected together and to the third voltage terminal and having its emitter connected to the second node; and a sixth bipolar transistor, having its collector-emitter path connected in series with the first voltage terminal and then through a third resistor to the second voltage terminal, the emitter of the sixth bipolar transistor also being connected to the output terminal;

the receiver and level converter circuit being configured to convert ECL-level signals at the input terminal to CMOS or BICMOS-level signals at the output terminal.

* * * * *

UNITED STATES PATENT AND TRADEMARK OFFICE
CERTIFICATE OF CORRECTION

| | | |
|---|---|---|
| PATENT NO. | : | 5,030,856 |
| DATED | : | July 9, 1991 |
| INVENTOR(S) | : | A. H. Dansky, C. J. Rebeor and D. C. Reedy |

It is certified that error appears in the above-identified patent and that said Letters Patent is hereby corrected as shown below:

<u>Col. 13</u>

In Claim 9, line 2, after "signal;" please insert:
--     a phase inverter circuit having an input and an--.

Signed and Sealed this

Fifth Day of January, 1993

Attest:

DOUGLAS B. COMER

*Attesting Officer*      *Acting Commissioner of Patents and Trademarks*